(12) United States Patent
Park et al.

(10) Patent No.: US 7,122,441 B2
(45) Date of Patent: Oct. 17, 2006

(54) METHOD OF FABRICATING A PLURALITY OF FERROELECTRIC CAPACITORS

(75) Inventors: Jung-Hoon Park, Gyeonggi-do (KR); Hyun-Ho Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 80 days.

(21) Appl. No.: 11/044,958

(22) Filed: Jan. 26, 2005

(65) Prior Publication Data

US 2005/0164488 A1  Jul. 28, 2005

(30) Foreign Application Priority Data

Jan. 26, 2004 (KR) .................. 10-2004-0004845

(51) Int. Cl.
*H01L 21/8234* (2006.01)
(52) U.S. Cl. .................. 438/396; 438/393; 438/622; 257/E21.647; 257/E21.664
(58) Field of Classification Search ............... 438/396, 438/393, 622
See application file for complete search history.

(56) References Cited

U.S. PATENT DOCUMENTS

| 6,211,035 B1 | 4/2001 | Moise et al. | |
| 2002/0014646 A1* | 2/2002 | Tsu et al. | 257/296 |
| 2004/0178451 A1* | 9/2004 | Yagishita et al. | 257/347 |

FOREIGN PATENT DOCUMENTS

| JP | 2002-094014 | 3/2002 |
| KR | 2001-0005096 | 1/2001 |
| KR | 2002-0018865 | 3/2002 |

OTHER PUBLICATIONS

English language abstract of Korean Publication No. 2001-0005096.
English language abstract of Korean Publication No. 2002-0018865.
English language abstract of Japanese Publication No. 2002-094014.

* cited by examiner

*Primary Examiner*—Asok K. Sarkar
*Assistant Examiner*—Victor V. Yevsikov
(74) *Attorney, Agent, or Firm*—Marger Johnson & McCollom, P.C.

(57) ABSTRACT

In one embodiment, a plurality of bottom electrodes spaced apart from each other are formed on a lower insulating layer. A high-k dielectric layer and an upper conductive layer are sequentially and conformally formed overlying the bottom electrodes. The high-k dielectric layer and the upper conductive layer cover the bottom electrodes and the lower insulating layer between the bottom electrodes. A hard mask layer is selectively formed on the upper conductive layer to have an overhang over each of the bottom electrodes. Then the upper conductive layer is anisotropically etched using the hard mask layer as an etch mask, thereby forming upper electrodes spaced from each other. Therefore, a photolithography process of forming upper electrodes can be omitted, and damage to the upper electrodes due to etch can be prevented.

20 Claims, 9 Drawing Sheets

METHOD OF FABRICATING A PLURALITY OF FERROELECTRIC CAPACITORS

CROSS-REFERENCE TO RELATED APPLICATION

This application claims the benefit of Korean Patent Application No. 2004-4845, filed Jan. 26, 2004, the disclosure of which is hereby incorporated herein by reference in its entirety.

BACKGROUND

1. Field of the Invention

The present invention relates to a method of fabricating a semiconductor device, and more particularly, to a method of fabricating a ferroelectric random access memory cell having the ferroelectric capacitors.

2. Description of the Related Art

A ferroelectric random access memory (FeRAM) is a nonvolatile random access memory, utilizing ferroelectric capacitors as a memory device. Further, the FeRAM offers many advantages over other memories, in which the FeRAM is characterized by a relatively high operational speed, relatively low voltage programming, relatively low power consumption, and also radiation hardness. Because of these properties, the FeRAM is noted as a next-generation memory device.

The ferroelectric capacitor includes a bottom electrode, an upper electrode, and a high-k dielectric layer interposed between the bottom electrode and the upper electrode. The high-k dielectric layer has bistable polarization states. Thus, if a voltage is applied between the upper electrode and the bottom electrode, and an electric field above a coercive force (Ec) is generated, the high-k dielectric layer is polarized into one state. Then, even though an electric potential is lost, the high-k dielectric layer maintains the polarization state. If a voltage of an opposite direction to the above voltage is applied between the upper electrode and the bottom electrode, and an electric field above the coercive force (Ec) is generated with an opposite direction to the above electric field, the high-k dielectric layer is polarized into the other state. The FeRAM stores information using bistable polarization states of the high-k dielectric layer. Thus, in order to program and read information to the ferroelectric capacitor, it is necessary to apply a pulse-type voltage to the upper electrode.

Further, the ferroelectric capacitor has high capacitance. In the FeRAM, it is necessary to connect a limited number of ferroelectric capacitors to a common plate line, in order to apply a pulse-type voltage to the upper electrode, unlike DRAM. Therefore, the upper electrodes need to be separated from each other.

Further, in order to achieve a highly-integrated FeRAM, a higher number of capacitors should be formed inside a unit cell array, like DRAM. Therefore, the ferroelectric capacitors need to be formed three-dimensionally. A method of forming the ferroelectric capacitors three-dimensionally includes a trench-type capacitor and a box-type capacitor.

The method of forming the box-type capacitor is disclosed in U.S. Pat. No. 6,211,035 in the title of "Integrated circuit and method" to Moise, et al.

According to the disclosure by Moise, et al, a lower insulating layer is formed on a semiconductor substrate. Bottom electrodes are formed on the lower insulating layer. A high-k dielectric layer such as strontium bismuth tantalate ($SrBi_2Ta_2O_5$; SBT) is conformally formed on the semiconductor substrate having the bottom electrodes, and then, an upper electrode layer is formed. Then, a diffusion barrier layer, a reflection preventive layer and photoresist are sequentially deposited. The photoresist is exposed and developed, thereby confining the positions of drive lines for a FeRAM cell array. Then, the reflection preventive layer, the diffusion barrier layer, the upper electrode layer, and the high-k dielectric layer are etched, using the patterned photoresist as a mask. Thus, box-type ferroelectric capacitors are formed.

In the method, it is advantageous that the box-type ferroelectric capacitors are formed, and a large number of these capacitors are formed inside a unit cell array. However, the method includes forming photoresist and patterning through photolithography in order to etch the upper electrode layer. Thus, the patterned photoresist should be aligned with the bottom electrodes. However, with a high-integration of the FeRAM, it is difficult to pattern the photoresist to be aligned with the bottom electrodes. Thus, a misalignment may be generated. The misalignment results in etch damage to an upper electrode.

Therefore, the method has a difficulty in fabricating highly-integrated ferroelectric capacitors while preventing the etch damage to the upper electrode.

SUMMARY OF THE INVENTION

An exemplary embodiment of the present invention provides a method of fabricating a semiconductor device, e.g., a plurality of box-type ferroelectric capacitors. The method includes forming a lower insulating layer on a semiconductor substrate. A plurality of box-type bottom electrodes separated from each other are formed on the lower insulating layer. Then, a high-k dielectric layer and an upper conductive layer are sequentially and conformally formed on the semiconductor substrate having the bottom electrodes. The high-k dielectric layer and the upper conductive layer cover the bottom electrodes and the lower insulating layer between the bottom electrodes. A hard mask layer is selectively formed on the upper conductive layer. The hard mask layer is formed with an overhang over each of the bottom electrodes. Then, the upper conductive layer is anisotropically etched using the hard mask layer as an etch mask, thereby forming upper electrodes separated from each other. Therefore, a photolithography process of forming upper electrodes can be omitted, and the damage to the upper electrodes due to etch can be prevented.

Preferably, the process of selectively forming the hard mask layer may be performed using physical vapor deposition (PVD) or chemical vapor deposition (CVD) technology, which has poor step coverage characteristics. The PVD may be sputtering technology, and the CVD may be plasma enhanced chemical vapor deposition (PECVD) technology. More preferably, the process of selectively forming the hard mask layer may include depositing a metal material using sputtering technology, or depositing a dielectric material using CVD technology. The metal material or the dielectric material may be deposited on the upper conductive layer located over the bottom electrodes thicker than on other regions. Further, the metal material or the dielectric material may be deposited to expose at least a portion of the upper conductive layer formed between the bottom electrodes.

Further, the hard mask layer may include a titanium nitride (TiN) layer, or a titanium aluminum nitride (TiAlN) layer, and may include a PE-TEOS layer and a PE-oxide layer.

BRIEF DESCRIPTION OF THE DRAWINGS

The above and other features and advantages of the present invention will become more apparent to those of ordinary skill in the art by describing in detail preferred embodiments with reference to the attached drawings, in which.

DETAILED DESCRIPTION OF THE PREFERRED EMBODIMENTS

Figure 1:
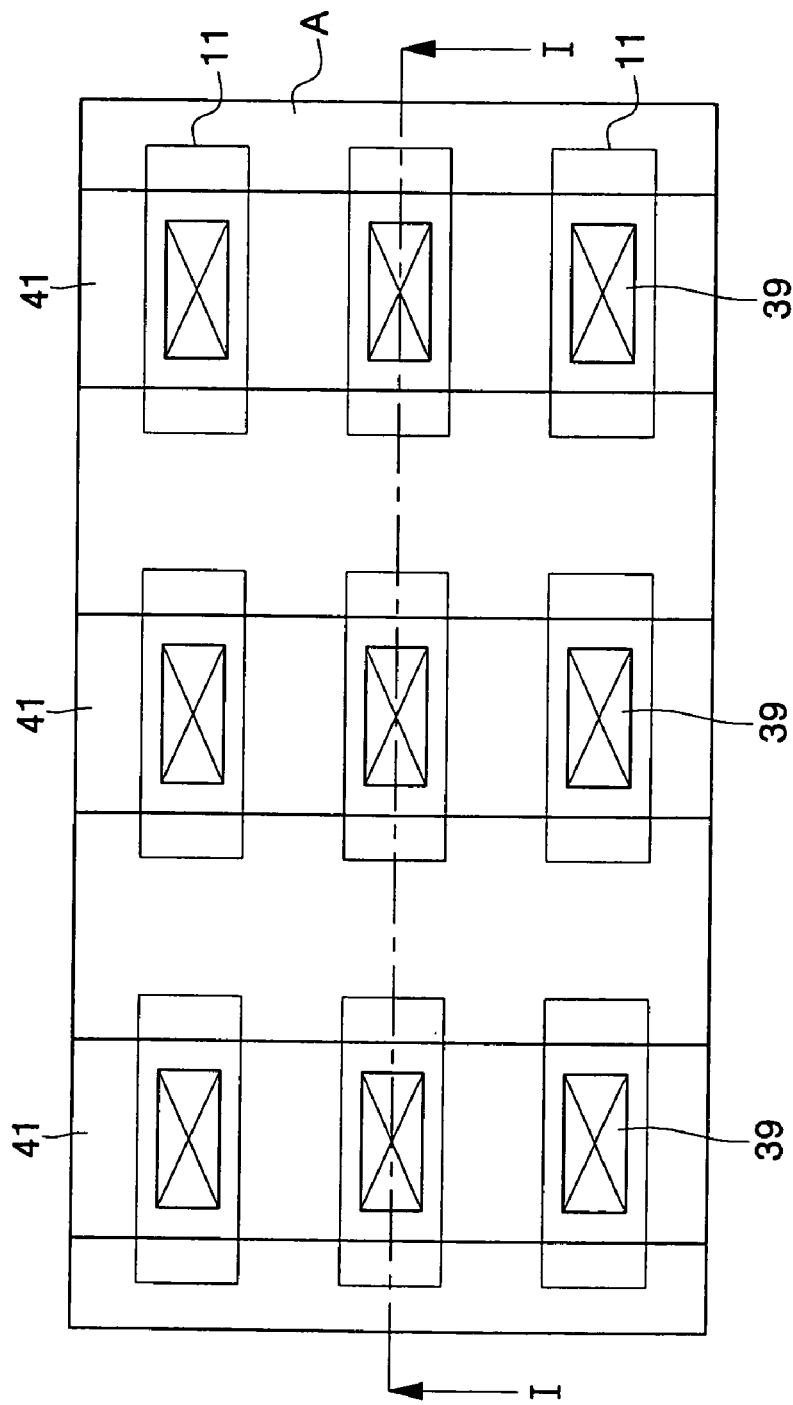
FIG. 1 is a layout illustrating ferroelectric capacitors of a FeRAM cell according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Same reference numbers refer to same elements throughout the specification.

FIG. 1 is a layout illustrating ferroelectric capacitors of a FeRAM cell according to an embodiment of the present invention, and FIGS. 2 to 8 are schematic sectional views taken along a line of I—I of FIG. 1 illustrating a method of fabricating ferroelectric capacitors according to an embodiment of the present invention. In FIG. 1, a reference mark "A" represents a portion of a cell region of a FeRAM.

Figure 2:
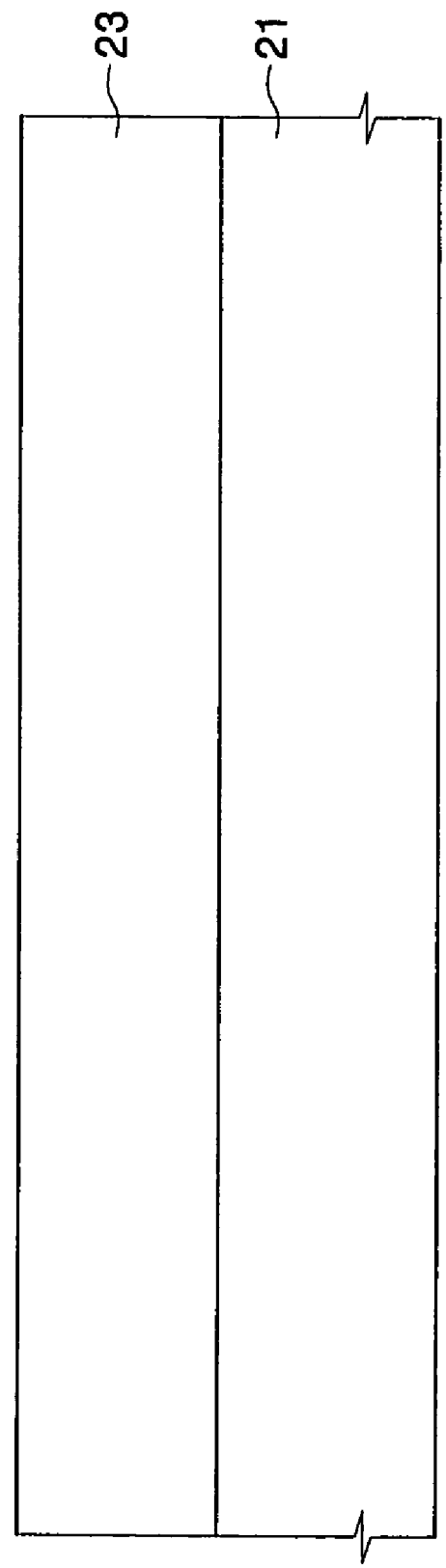
FIGS. 2 to 8 are schematic sectional views taken along a line of I—I of FIG. 1 illustrating a method of fabricating ferroelectric capacitors according to an embodiment of the present invention.

Referring to FIGS. 1 and 2, a lower insulating layer 23 is formed on a semiconductor substrate 21. Cell transistors (not shown) are formed inside the semiconductor substrate 21. Each of the cell transistors includes source/drain regions separated from each other by a channel region. Further, word lines are disposed to intersect over the channel regions. Further, bit lines are formed inside the semiconductor substrate 21, and the bit lines are electrically connected to the drains of the cell transistors. Further, a contact pad (not shown) may be formed on each of the source regions.

The bit lines and the ferroelectric capacitors 11 are insulated by the lower insulating layer 23.

Figure 3:
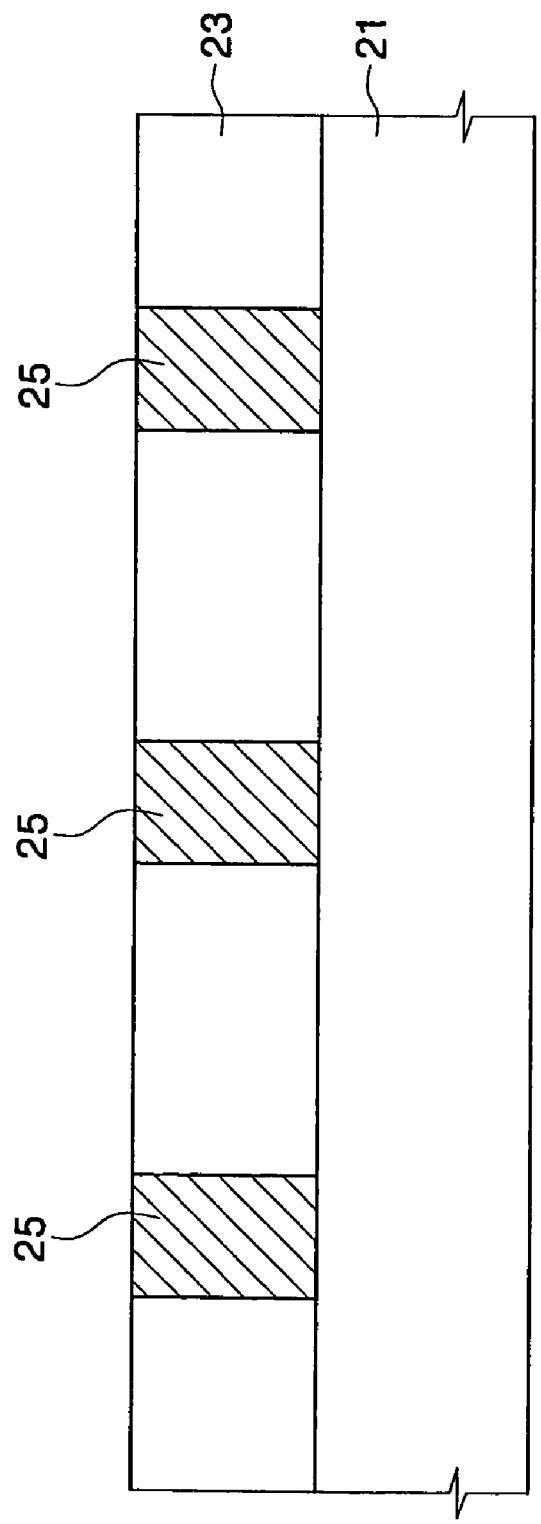

Referring to FIGS. 1 and 3, the lower insulating layer 23 is patterned using photolithography/etch processes, thereby forming contact holes penetrating the lower insulating layer 23. The contact holes may expose the source regions of the semiconductor substrate 21 directly. In the case of forming the contact pads, the contact holes expose the contact pads. The contact holes may be formed using a self-aligned contact technology.

Contact plugs 25 for filling the contact holes are formed. The contact plugs 25 are electrically connected to the source regions. The formation of the contact plugs 25 may include forming a plug conductive layer on the semiconductor substrate having the contact holes, and the plug conductive layer fills the contact holes. Until the upper surface of the lower insulating layer 23 is exposed, the plug conductive layer is overall-etched or planarized. The plug conductive layer may include tungsten (W).

Figure 4:
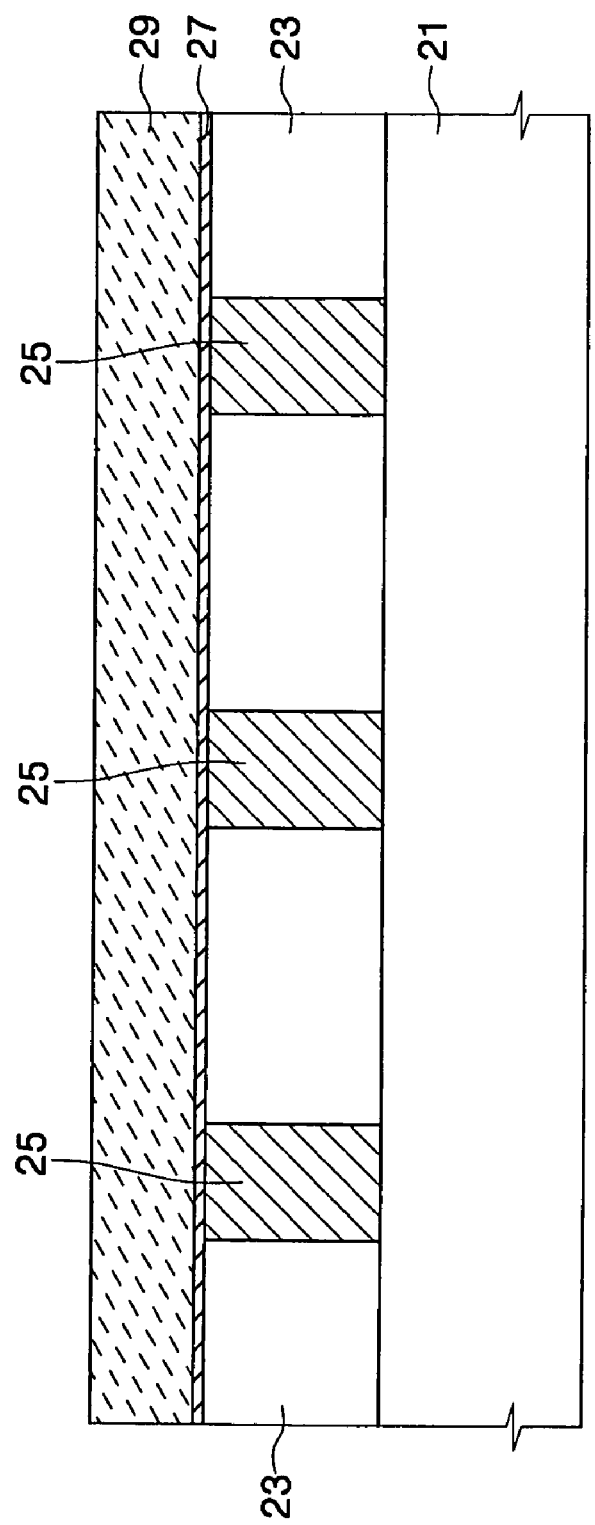

Referring to FIGS. 1 and 4, a lower conductive layer 29 is formed on the semiconductor substrate 21 having the contact plugs 25. The lower conductive layer 29 may be formed using a sputtering technology. Preferably, the lower conductive layer 29 may be composed of noble metal such as platinum (Pt), ruthenium (Ru), iridium (Ir), or iridium oxide (IrO2), and it may be a laminated layer or a composite layer.

The lower conductive layer 29 is formed with an appropriate thickness in consideration of an effective area of the ferroelectric capacitor.

Further, a diffusion barrier layer 27 may be formed before forming the lower conductive layer 29. The diffusion barrier layer 27 may function to prevent an inter-diffusion between the contact plug 25 and the lower conductive layer 29, and can enhance an adhesive force of the lower conductive layer 29. Preferably, the diffusion barrier layer 27 may be composed of a TiAlN layer.

Figure 5:
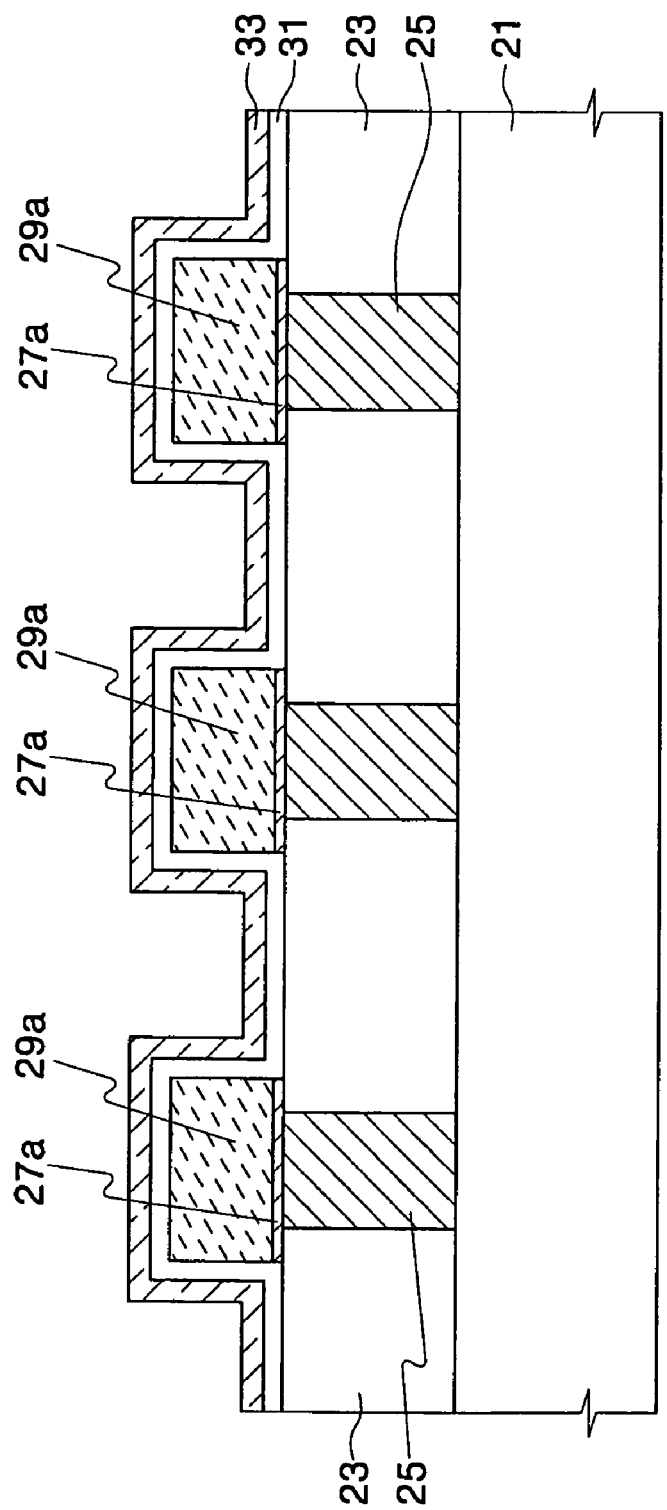

Referring to FIGS. 1 and 5, the lower conductive layer 29 is patterned using photolithography/etch processes, thereby forming bottom electrodes 29a, which are electrically connected to the contact plugs 25 respectively. At this time, the diffusion barrier layer 25 is etched together with the lower conductive layer 29, thereby exposing the lower insulating layer 23.

A mask layer (not shown) may be formed on the lower conductive layer 29 in order to pattern the lower conductive layer 29. The mask layer may be a TiAlN layer. After patterning the mask layer, thereby forming a mask pattern, the lower conductive layer 29 may be etched using the mask pattern as an etch mask.

As shown in FIG. 1, the bottom electrodes 29a may be aligned as an orthogonal type, but they are not limited thereto. The bottom electrodes 29a may be aligned in other configurations, for example, square or hexagonal, in order to increase a cell area efficiency.

A high-k dielectric layer 31 and an upper conductive layer 33 are sequentially and conformally formed on the semiconductor substrate having the bottom electrodes 29a. The high-k dielectric layer 31 and the upper conductive layer 33 cover the bottom electrodes 29a, and the lower insulating layer 23 exposed between the bottom electrodes 29a. Preferably, the high-k dielectric layer 31 may be formed of a lead zirconate titanate ($PbZr_xTi_{1-x}O_3$: PZT) layer, a bismuth lanthanum titanate ($Bi_{4-x}La_xTi_3O_{12}$) layer, or SBT, using a CVD technology. Further, the upper conductive layer 33 may be composed of noble metal such as platinum (Pt), ruthenium (Ru), iridium (Ir), or iridium oxide ($IrO_2$), and it may be a laminated layer or a composite layer. The upper conductive layer 33 is preferably formed using chemical vapor deposition (CVD) or atomic layer deposition (ALD) technology.

Figure 6A:
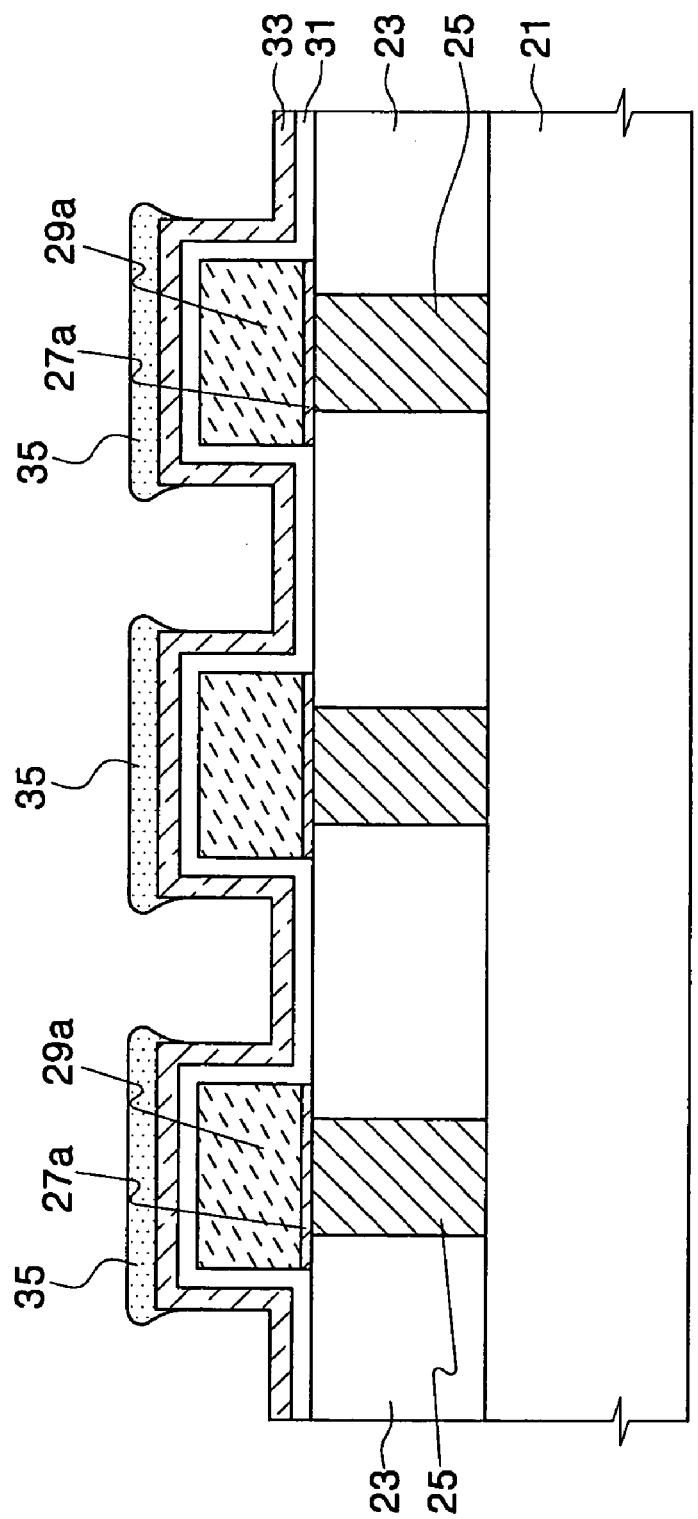

Referring to FIGS. 1 and 6a, a hard mask layer 35 is selectively formed on the semiconductor substrate having the upper conductive layer 33. The hard mask layer 35 is formed with overhangs on each of the bottom electrodes 29a. The hard mask layer 35 may be selectively formed using physical vapor deposition (PVD) or chemical vapor deposition (CVD) technology, which has poor step coverage characteristics. The PVD process may be performed by a sputtering technology, and the CVD process may perform a plasma enhanced chemical vapor deposition (PECVD) technology.

Preferably, the hard mask layer 35 may be selectively formed by depositing a metal material using sputtering technology, or depositing a dielectric material using CVD technology. The metal material or the dielectric material is deposited thickly on the upper conductive layer 33 located over the bottom electrode 29a, but may not be deposited between the bottom electrodes 29a. As a result, the upper conductive layer 33, which is disposed to cover the sidewalls of the bottom electrodes 29a, and the lower insulating layer 23 between the bottom electrodes 29a is exposed.

Figure 6B:
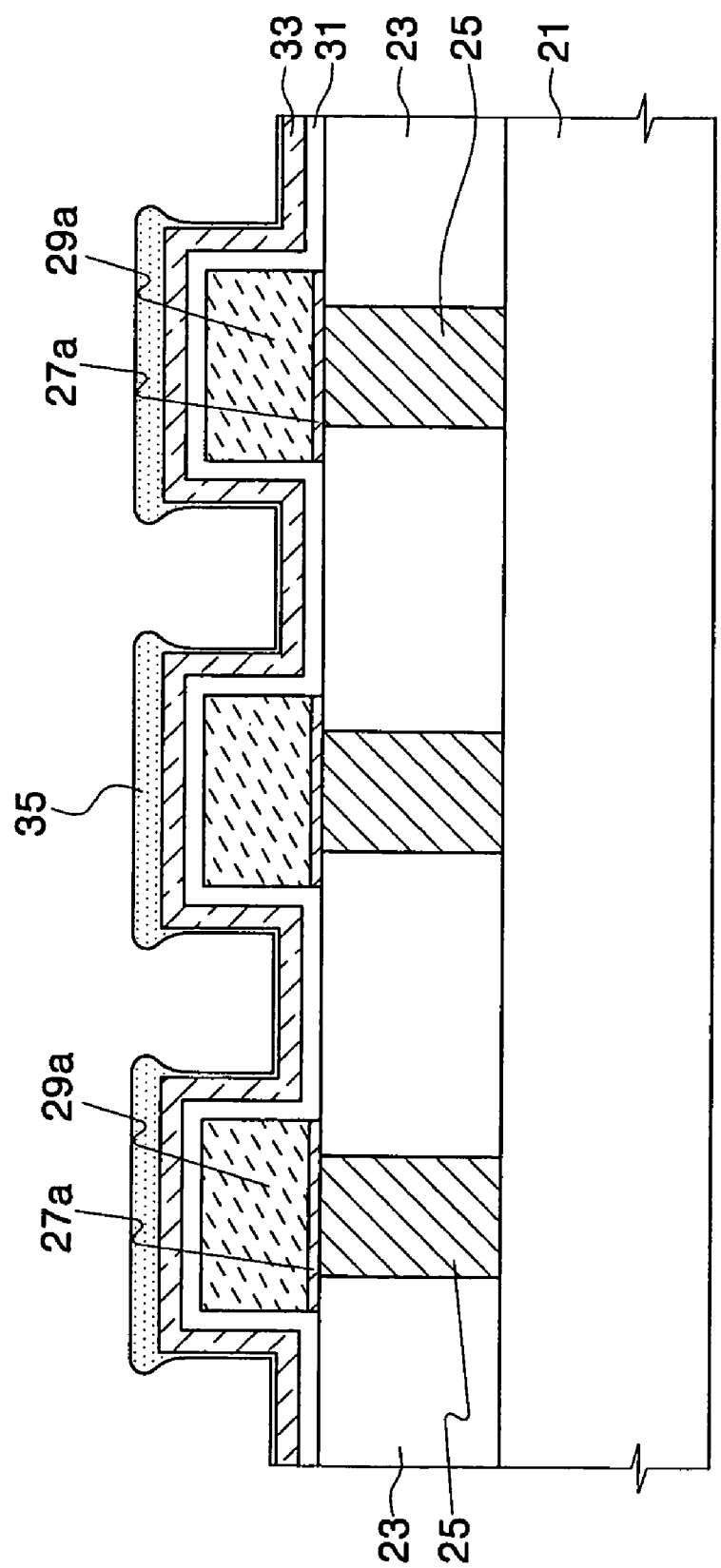

Further, as shown in FIG. 6B, the metal material or the dielectric material may be deposited on the upper conductive layer 33, which covers the sidewalls of the bottom electrodes 29a and the lower insulating layer 23 between the bottom electrodes 29a. As a result, the hard mask layer 35 is formed on the upper conductive layer 33, which covers the sidewalls of the bottom electrodes 29a and the lower insulating layer 23 between the bottom electrodes 29a. However, since the deposition technology having poor step coverage characteristics is used, the hard mask layer 35 is formed thicker on the upper conductive layer 33 that covers the bottom electrodes 29a than on the upper conductive layer 33 of other regions.

Preferably, the hard mask layer 35 may include a TiN layer or a TiAlN layer. The layer may be directly formed using reactive sputtering technology. Alternatively, after depositing Ti or TiAl using sputtering technology, the deposited material layer is nitrified, thereby forming a TiN layer or a TiAlN layer. Further, the hard mask layer 35 may include a PE-TEOS layer or a PE-oxide layer. The layer may be directly formed using PECVD technology.

Figure 7:
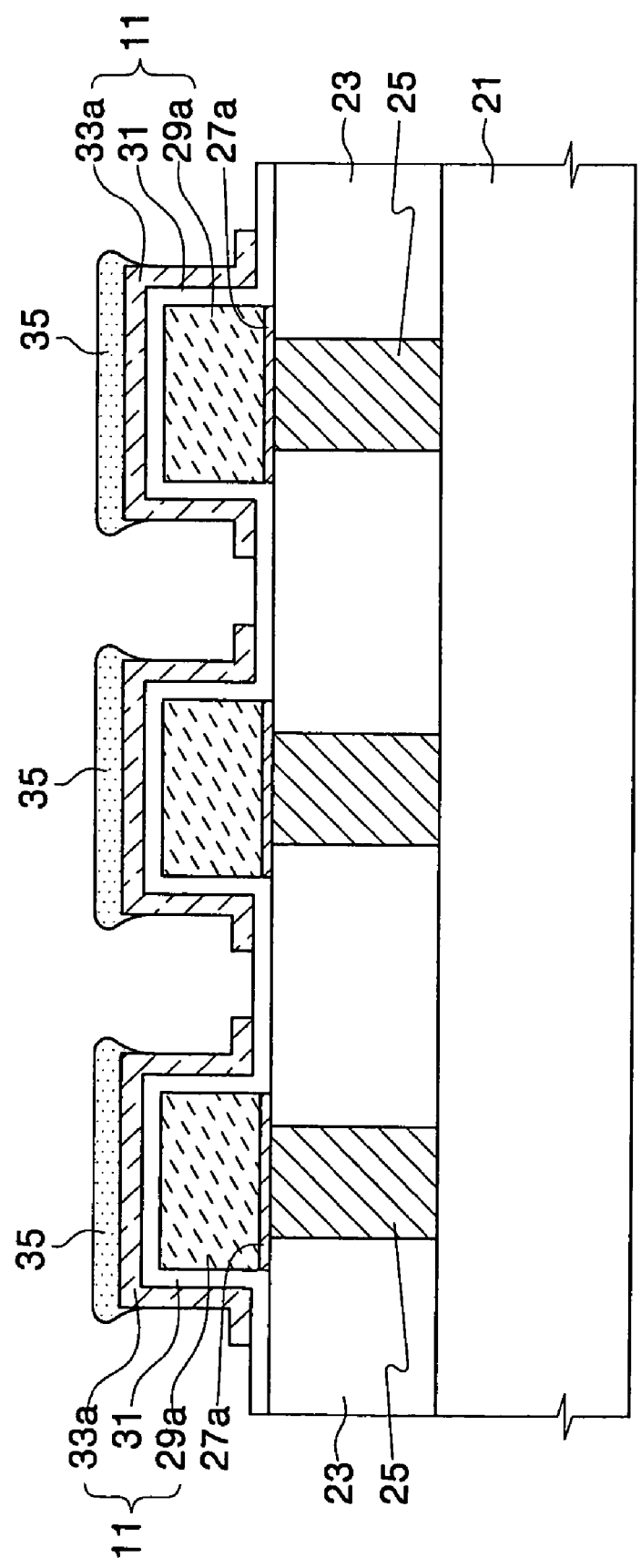

Referring to FIGS. 1 and 7, the upper conductive layer 33 is anisotropically etched, using the hard mask layer 35 as an etch mask. As a result, upper electrodes 33a, which are electrically separated from each other, are formed, thereby completing the formation of the ferroelectric capacitors 11. Each of the upper electrodes 33a covers the sidewalls of each of the bottom electrodes 29a and the region over each of the bottom electrodes 29a. While the upper conductive layer 33 is anisotropically etched, the upper conductive layer 33, which covers the sidewalls of the bottom electrodes 29a by the overhangs of the hard mask layer 35, can be prevented from being damaged by etching.

As shown in FIG. 6B, the hard mask layer 35 may cover the upper conductive layer 33 between the bottom electrodes 29a. The hard mask layer 35 that covers the upper conductive layer 33 between the bottom electrodes 29a is thinner than the hard mask layer 35 that covers the upper conductive layer 33 located over the bottom electrodes 29a. Therefore the part of the hard mask layer 35 that covers the upper conductive layer 33 between the bottom electrodes 29a may be removed when anisotropically etched. Further, before performing the anisotropic etching process, the upper conductive layer 33 between the bottom electrodes 29a may be removed.

Figure 8:
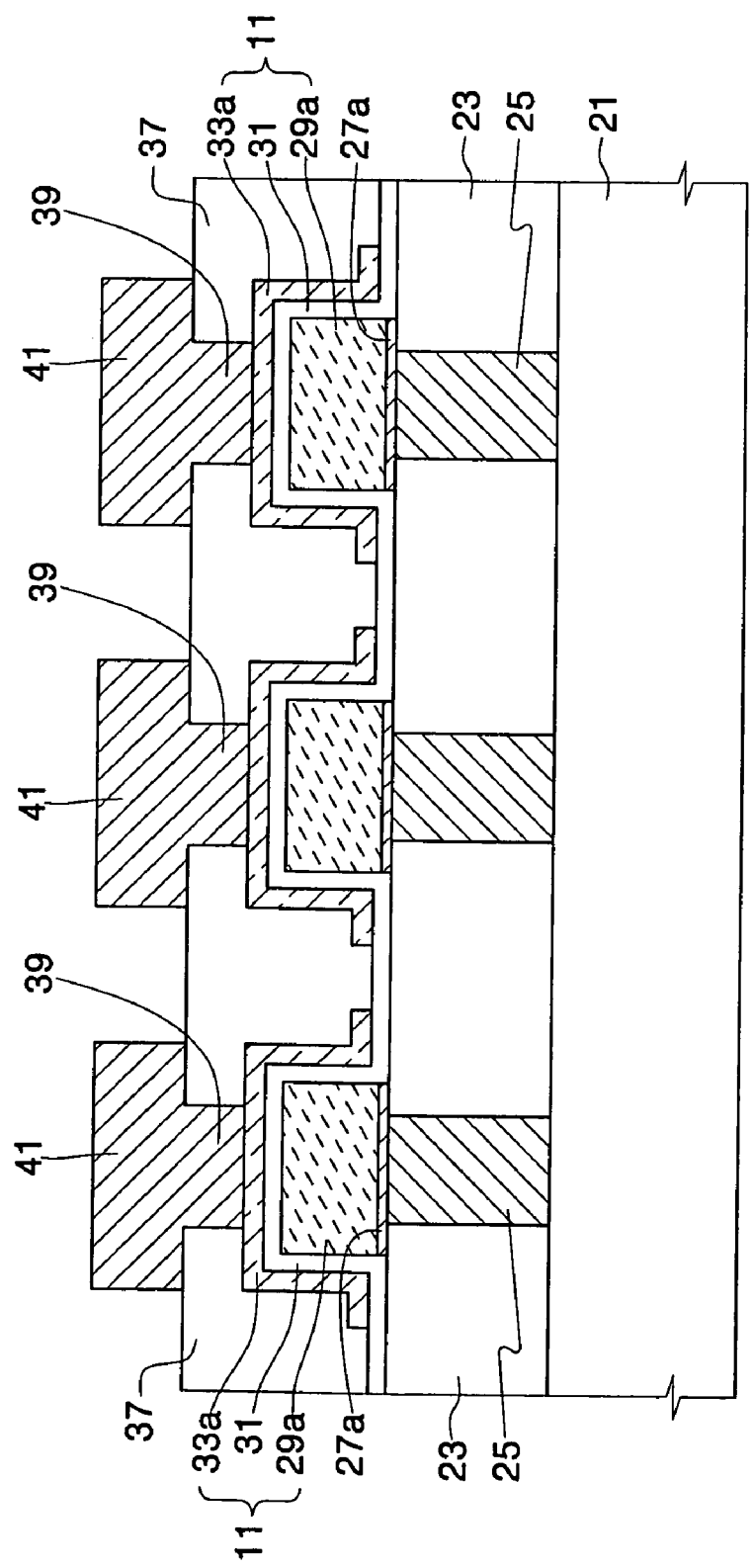

Referring to FIGS. 1 and 8, an upper insulating layer 37 is formed on the semiconductor substrate having the upper electrodes 33a formed thereon. The upper insulating layer 37 is formed of an insulating layer having good gap filling characteristics. Preferably, before forming the upper insulating layer 37, the hard mask layer 35 is removed. Thus, an empty space between the upper electrodes 33a can be easily filled with the upper insulating layer 37.

The upper insulating layer 37 is patterned, thereby forming via holes for exposing the upper electrodes 33a.

Then, a plate conductive layer is formed for filling the via holes and covering the upper insulating layer 37 on the semiconductor substrate having the via holes. Preferably, the plate conductive layer may be an Al layer. The plate conductive layer is patterned, thereby forming plate lines 41, which are electrically connected to the upper electrodes 33a through the via holes.

Alternatively, via plugs 39 for filling the via holes may be first formed. Then, a plate conductive layer for covering the via plugs 39 and the upper insulating layer 37 may be formed, and it may be patterned, thereby forming plate lines 41.

Each of the plate lines 41 is commonly connected to each of a predetermined number of ferroelectric capacitors 11.

According to an embodiment of the present invention, using a hard mask layer having overhangs, a photolithography process of forming upper electrodes separated from each other can be omitted, and etching damage to the upper electrodes can be prevented. Therefore, there are provided a method of fabricating a plurality of highly-integrated ferroelectric capacitors, and a method of fabricating a FeRAM cell having the same.

Although the invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A method of fabricating a semiconductor device, the method comprising:
    forming a lower insulating layer on a semiconductor substrate;
    forming a plurality of bottom electrodes separated from each other on the lower insulating layer;
    sequentially forming a high-k dielectric layer and an upper conductive layer conformally overlying the bottom electrodes;
    selectively forming a hard mask layer on the upper conductive layer, the hard mask layer having an overhang over each of the bottom electrodes; and
    anisotropically etching the upper conductive layer using the hard mask layer as an etch mask, thereby forming upper electrodes separated from each other.

2. The method according to claim 1, wherein the process of selectively forming the hard mask layer comprises depositing a metal material using sputtering technology.

3. The method according to claim 2, wherein the metal material is deposited on the upper conductive layer located over the bottom electrodes thicker than on other regions.

4. The method according to claim 2, wherein the metal material is deposited to expose at least a portion of the upper conductive layer formed between the bottom electrodes.

5. The method according to claim 4, wherein the hard mask layer includes at least one selected from the group consisting of TiN and TiAlN.

6. The method according to claim 2, further comprising nitrifying the deposited metal material.

7. The method according to claim 1, wherein the hard mask layer includes at least one selected from the group consisting of TiN and TiAlN.

8. The method according to claim 1, wherein the process of selectively forming the hard mask layer comprises depositing a dielectric material using CVD technology.

9. The method according to claim 8, wherein the dielectric material is deposited on the upper conductive layer located over the bottom electrodes thicker than on other regions.

10. The method according to claim 8, wherein the dielectric material is deposited to expose at least a portion of the upper conductive layer formed between the bottom electrodes.

11. The method according to claim 10, wherein the hard mask layer includes at least one selected from the group consisting of a PE-TEOS layer and a PE-oxide layer.

12. The method according to claim 1, wherein the hard mask layer includes at least one selected from the group consisting of a PE-TEOS layer and a PE-oxide layer.

13. A method of fabricating a semiconductor device, the method comprising:
    forming a lower insulating layer on a semiconductor substrate;
    patterning the lower insulating layer, thereby forming contact holes penetrating the lower insulating layer;
    forming metal plugs filling the contact holes;
    forming a diffusion barrier layer on the semiconductor substrate having the metal plugs;
    forming a lower conductive layer on the diffusion barrier layer;
    sequentially patterning the lower conductive layer and the diffusion barrier layer, thereby forming a plurality of box-type bottom electrodes separated from each other;
    sequentially forming a high-k dielectric layer and an upper conductive layer conformally overlying the bottom electrodes;
    selectively forming a hard mask layer on the upper conductive layer, the hard mask layer having an overhang over each of the bottom electrodes; and
    anisotropically etching the upper conductive layer using the hard mask layer as an etch mask, thereby forming upper electrodes separated from each other.

14. The method according to claim 13, wherein the process of selectively forming the hard mask layer includes depositing a metal material using sputtering technology.

15. The method according to claim 13, wherein the hard mask layer includes at least one selected from the group consisting of TiN and TiAlN.

16. The method according to claim 15, further comprising:
    forming an upper insulating layer on the semiconductor substrate having the upper electrodes;
    patterning the upper insulating layer, thereby forming via holes to expose the upper electrodes; and
    forming plate lines electrically connected to the upper electrodes through the via holes.

17. The method according to claim 16, further comprising, before forming the upper insulating layer, removing the hard mask layer.

18. The method according to claim 13, wherein the process of selectively forming the hard mask layer includes depositing a dielectric material using CVD technology.

19. The method according to claim 18, further comprising:
    forming an upper insulating layer on the semiconductor substrate having the upper electrodes;
    patterning the upper insulating layer, thereby forming via holes to expose the upper electrodes; and
    forming plate lines electrically connected to the upper electrodes through the via holes.

20. The method according to claim 19, further comprising, before forming the upper insulating layer, removing the hard mask layer.

* * * * *